United States Patent [19]

Kuwano et al.

[11] 4,281,208

[45] Jul. 28, 1981

[54] PHOTOVOLTAIC DEVICE AND METHOD OF MANUFACTURING THEREOF

[75] Inventors: Yukinori Kuwano, Takatsuki; Terutoyo Imai, Hirakata; Masakazu Umetani, Nagoya, all of Japan

[73] Assignee: Sanyo Electric Co., Ltd., Osaka, Japan

[21] Appl. No.: 116,402

[22] Filed: Jan. 29, 1980

[30] Foreign Application Priority Data

| Feb. 9, 1979 | [JP] | Japan | 54-14497 |
|---|---|---|---|
| Feb. 9, 1979 | [JP] | Japan | 54-14498 |
| Mar. 9, 1979 | [JP] | Japan | 54-27801 |
| Mar. 12, 1979 | [JP] | Japan | 54-28922 |
| Mar. 12, 1979 | [JP] | Japan | 54-28923 |
| Mar. 16, 1979 | [JP] | Japan | 54-31305 |
| Mar. 16, 1979 | [JP] | Japan | 54-31306 |

[51] Int. Cl.³ ................ H01L 31/06; H01L 31/18
[52] U.S. Cl. .................... 136/249; 29/572; 136/244; 136/251; 136/258; 136/291; 156/643; 204/192 EC; 148/1.5; 357/30; 357/91; 427/74
[58] Field of Search .......... 136/89 MS, 89 P, 89 TF, 136/89 AC, 89 EP, 249, 244, 258, 291, 251; 204/192 P, 192 E, 192 EC; 148/1.5; 427/74; 29/572; 357/30, 91; 156/643

[56] References Cited

U.S. PATENT DOCUMENTS

| 3,483,038 | 12/1969 | Hui et al. | 136/244 |
|---|---|---|---|
| 3,571,915 | 3/1971 | Shirland | 29/572 |
| 3,977,904 | 8/1976 | Köhler | 136/246 |
| 4,042,418 | 8/1977 | Biter | 136/89 P |
| 4,122,396 | 10/1978 | Grazier et al. | 325/492 |

FOREIGN PATENT DOCUMENTS

| 2839038 | 3/1979 | Fed. Rep. of Germany | 136/260 |
|---|---|---|---|
| 2023929 | 1/1980 | United Kingdom | 136/244 |

OTHER PUBLICATIONS

D. E. Carlson, "Amorphous-Silicon Solar Cells", Quarterly Report No. 6, Jun. 1978, RCA Labs., Princeton, N.J., prepared for U.S. Dept. of Energy, Contract No. EY-76-C-03-1286, pp. 23-26.

Primary Examiner—Aaron Weisstuch
Attorney, Agent, or Firm—Darby & Darby

[57] ABSTRACT

A photovoltaic device comprises a light transmissive insulating substrate, on which a plurality of isolated transparent electrodes are formed. An amorphous silicon layer of a PIN structure, for example, is formed on the substrate continuously and in common to the respective transparent electrodes. Aluminum electrodes are formed on the surface of the amorphous silicon layer so as to correspond to the respective transparent electrodes. The transparent electrodes and the aluminum electrodes are electrically connected to the adjacent opponent electrodes to withdraw in a series fashion photovoltaic power generated at the respective photoelectric conversion regions.

75 Claims, 14 Drawing Figures

PHOTOVOLTAIC DEVICE AND METHOD OF MANUFACTURING THEREOF

BACKGROUND OF THE INVENTION

1. Field of the Invention

The present invention relates to a photovoltaic device. More specifically, the present invention relates to a photovoltaic device using amorphous silicon as a semiconductor material.

2. Description of the Prior Art

A photovoltaic device such as a solar battery, photosensor and the like is capable of directly converting solar radiation and the like into electrical energy. However, such photovoltaic devices involve a great problem in that the electricity generating cost is extremely high as compared with that of other electrical energy generating means. Major reasons for the above are that the utilization efficiency of the semiconductor material constituting a main portion of the device is low and the cost required for manufacturing such a semiconductor material is very high.

However, of late a photovoltaic device using a more inexpensive semiconductor material which solves the above described problems has been proposed. A typical photovoltaic device employing such material is disclosed in U.S. Pat. No. 4,064,521, issued Dec. 20, 1977 to David Emil Carlson and entitled "SEMICONDUCTOR DEVICE HAVING A BODY OF AMORPHOUS SILICON". Amorphous silicon used in such a photovoltaic device can be formed at low cost and on a mass production basis of a glow discharge in an atmosphere of a silicon compound such as silane, silicon fluoride or the like. Such amorphous silicon has an average local state density in the width of forbidden band as low as $10^{17}$ cm$^{-3}$ or less, with the possibility of control of a P type or N type impurity, as in the case of crystal line silicon.

FIG. 1 shows one example of a typical conventional photovoltaic device employing amorphous silicon which constitutes the background of the invention. Referring to FIG. 1, an amorphous silicon device comprises a P type layer 3, an intrinsic layer 4 and an N+ layer 5. A transparent electrode 2 and an ohmic contact electrode 6 are formed on opposite surfaces of the amorphous silicon layer and such composite is formed on a glass substrate 1. The N+ amorphous silicon layer 5 is formed as a highly impurity doped layer so as to serve as an ohmic contact to the electrode 6.

When a light beam impinges upon the amorphous silicon layer through the glass substrate 1 and the transparent electrode 2 in such a photovoltaic device as shown in FIG. 1, electrons and/or holes of a free state are generated mainly in the intrinsic layer 4. These are drawn by the PIN (I=Intrinsic) junction electric field formed in the amorphous silicon layer so as to be transported to and collected at the transparent electrode 2 and the ohmic electrode 6 serving as collecting means. Accordingly, a photovoltaic current of the magnitude associated with the intensity of the incidental light beam is withdrawn between the transparent electrode 2 and the ohmic electrode 6.

The FIG. 1 photovoltaic device produces a voltage of approximately 0.8 V under no load (Voc) conditions (and of 0.3 to 0.5 V as an operational voltage (Vop)) and as such cannot be used as a voltage source for equipment requiring a higher voltage.

On the other hand, it has been proposed that a plurality of small voltage generating devices be formed on a common substarate, thereby providing the necessary larger voltage. Such an apparatus is disclosed in, for example, Japanese Utility Model Publication Gazette No. 26064/1976 published for opposition July 20, 1976. However, the above referenced Japanese Utility Model Publication Gazette No. 26064/1976 shows an apparatus employing devices using selenium as a semiconductor material and fails to show a device employing amorphous silicon which is of most interest to the present invention.

Consequently, an implementation of a photovoltaic device such as disclosed in the above reference U.S. Pat. No. 4,064,521 in such an arrangement as disclosed in the above referenced Japanese Utility Model Publication Gazette No. 26064/1976 through mere aggregation thereof does not provide a device having excellent characteristics and mass productivity. More specifically, a composite selenium photocell disclosed in the above referenced Japanese Utility Model Publication Gazette No. 26064/1976 has a structure wherein a plurality of selenium photocells are formed on a single substrate such that semiconductor layers constituting the respective photocells are isolated from each other. Such formation of isolated semiconductor layers, however, results in a poor mass productivity because of the requirement of registration and the like. Furthermore, simple substitution of amorphous silicon disclosed in the above referenced U.S. Pat. No. 4,064,521 for the material of such semiconductor layers in the structure disclosed in the above referenced Japanese Utility Model Publication Gazette No. 26064/1976 further entails the following problem. More specifically, although in the case of the device disclosed in the above referenced Japanese Utility Mode Publication Gazette No. 26064/1976 formation of an oxide such as cadmium oxide occurs as the last step, the step of forming such oxide would damage the amorphous silicon layer. For example, since the P type layer of the amorphous silicon layer is as thin as approximately 50 Å to 100 Å, such oxide forming process would deteriorate the amorphous silicon layer and in the worst case the P type layer could disappear. Accordingly, conversion efficiency becomes lower in such damaged portions and hence a photovoltaic device of good efficiency is not provided. Furthermore, an approach could be thought of wherein a semitransparent metallic film is formed as a light transmissive film in the above referenced Japanese Utility Model Publication Gazette 26064/1976. However, in such a case, it is extremely difficult to form a metallic film of good light transmission and good electric conductivity. More specifically, in order to be more light transmissive, the light transmissive film needs to be thinner; however, it is extremely difficult to control the film thickness of such a film and to attain good reproducibility. Accordingly, even in such an approach, the mass productivity would be very poor as compared with that of the present invention.

SUMMARY OF THE INVENTION

In order to solve all of the above described problems, the present invention comprises a photovoltaic device including a single insulative substrate upon which a plurality of photoelectric converting regions are formed, wherein an amorphous silicon layer contributing to photoelectric conversion is formed continuously and in common to the respective photoelectric convertng regions, such that a photoelectromotive force generated at the respective photoelectric converting regions is withdrawn in series. Consequently, according to the present invention, a photovoltaic device of excellent mass productivity is provided, while the voltage obtained from the device is high.

In a preferred embodiment of the present invention, an insulating substrate is made of a radiation transmissive material, a plurality of transparent electrodes are formed isolated from each other on one main surface of the radiation transmissive insulating substrate, and then an amorphous silicon layer is formed continuously and in common to the respective transparent electrodes. Second electrodes are further formed on the continuous amorphous silicon layer such that pairs of the transparent electrodes and the second electrodes are formed with the amorphous silicon layer therebetween. The amorphous silicon layer is responsive to the radiation incident thereupon through the transparent electrodes from the radiation transmissive insulating substrate, thereby to generate electrons and/or holes. The electrons and/or holes thus generated are collected by the transparent electrodes and the second electrodes. The photoelectromotive force obtained by the paired electrodes of the respective photoelectric converting regions is withdrawn in series from the device.

In the above described preferred embodiment, since the transparent electrodes are formed on the radiation transmissive insulating substrate, it is not necessary to form the transparent electrodes after formation of the amorphous silicon layer and accordingly it is possible to form such transparent electrodes with simplicity and with relatively high accuracy. Furthermore, since the amorphous silicon layer is formed continuously and in common to the respective transparent electrodes, registration thereof becomes very easy, which enhances mass productivity of the inventive device.

Accordingly, a principal object of the present invention is to provide an improved photovoltaic device.

Another object of the present invention is to provide a photovoltaic device of excellent mass productivity.

A further object of the present invention is to provide a photovoltaic device that is capable of providing a high output voltage.

Still a further object of the present invention is to provide a phtovoltaic device having excellent converting efficiency.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
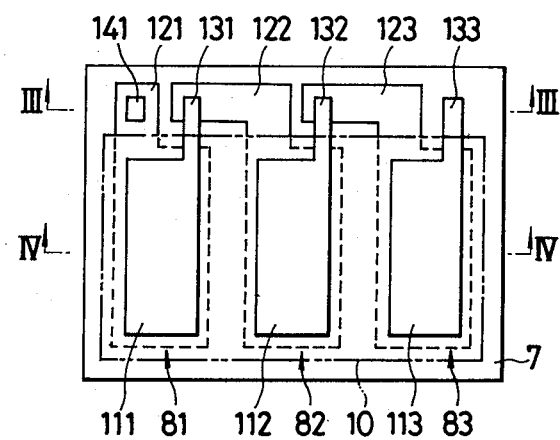
FIG. 2 is a plan view showing one embodiment of the present invention.
Figure 3:
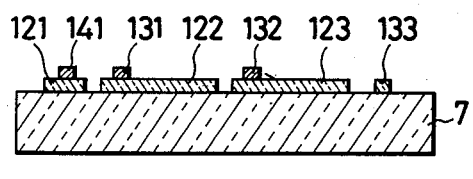
FIG. 3 is a sectional view of the FIG. 2 device taken along the line III—III.
Figure 4:
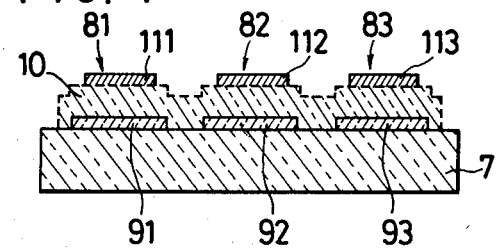
FIG. 4 is a sectional view of the FIG. 2 device taken along the line IV—IV.

FIG. 2 is a plan view showing one embodiment of the present invention. FIG. 3 is a sectional view of the FIG. 2 device taken along the line III—III and FIG. 4 is a sectional view of the FIG. 2 device taken along the line IV—IV. Referring to FIGS. 2, 3 and 4, the embodiment shown will be described in detail. An insulating substrate 7 made of the light transmissive and insulating material such as glass is prepared and a plurality of (three in case of the embodiment shown) photovoltaic regions or photoelectric converting regions 81, 82 and 83 are formed thereon. The respective photoelectric converting regions 81, 82 and 83 each comprise transparent conductive films or transparent electrodes 91, 92 and 93 formed on the light transmissive insulating substrate 7 spaced apart a predetermined distance. An amorphous silicon layer 10 is continuously formed in common to these transparent electrodes 91, 92 and 93 (FIGS. 2 and 4). Second electrodes 111, 112 and 113 are formed on the amorphous silicon layer 10 above the corresponding photoelectric converting regions 81, 82 and 83, respectively. Accordingly, the respective transparent electrodes 91, 92 and 93 each face the corresponding second electrodes 111, 112 and 113, respectively, with the amorphous silicon layer 10 sandwiched therebetween.

Figure 1:
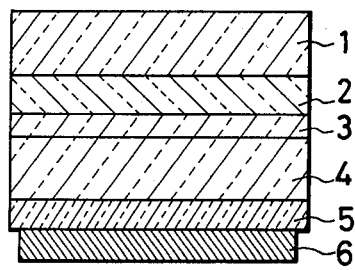
FIG. 1 is a diagrammatic view showing a cross section of one example of a typical photovoltaic device employing an amorphous silicon layer constituting the background of the present invention.

Although not shown, the amorphous silicon layer 10 is of the same structure as shown in FIG. 1 and comprises a P type layer (corresponding to the P type layer 3 shown in FIG. 1), an intrinsic layer I (corresponding to the intrinsic layer 4 shown in FIG. 1) and an N+ layer (corresponding to the N+ layer 5 shown in FIG. 1) formed in succession on the light transmissive insulating substrate 7. As described previously, the amorphous silicon layer 10 if formed continuously to extend throughout the respective photovoltaic regions or photoelectric converting regions 81, 82 and 83. The respective layers constituting the amorphous silicon layer 10 will now be described in detail. The P type layer is 40 to 1000 A thick with a dopant concentration of 0.01 to 3 percent, preferably 0.01 to 1 percent. The non-doped layer is 0.1 to 10 $\mu$m thick, preferably 0.5 to 2 $\mu$m thick. The N type layer is 40 to 10,000 A thick, preferably 200 to 1000 A thick, with the dopant concentration being 0.01 to 3 percent. These layers are formed at a temperature of 100 to 400° C., preferably 200 to 400° C. The amorphous silicon layer 10 can be formed in the manner as described in the above referenced U.S. Pat. No. 4,064,521.

The transparent electrodes 91, 92 and 93 are light transparent and electrically conductive and may be formed of tin oxide ($SnO_2$), indium oxide ($In_2O_3$), indium tin oxide ($In_2O_3 + SnO_2$), or the like. In the embodiment shown, the transparent electrodes 91, 92 and 93 were formed of indium tin oxide. The second electrodes 111, 112 and 113 can be formed of an electrically conductive material such as aluminum, chrominum or the like.

The embodiment shown is characterized by a configuration or an arrangment of the transparent electrodes 91, 92 and 93 and the second electrodes 111, 112 and 113. More specifically, the first electrodes or transparent electrodes 91, 92 and 93 and the second electrodes 111, 112 and 113 of the respective photoelectric converting regions 81, 82 and 83 have extentions 121, 122 and 123, and 131, 132 and 133, respectively, formed on the glass substrate 7 extending outward of the amorphous silicon layer 10 (FIG. 2). The extension 131 of the second electrode 111 of the first photovoltaic region 81 and the extension 122 of the first electrode or transparent electrode 92 of the second phtovoltaic region 82 are formed so as to be superposed, so that these extensions 131 and 122 are electrically connected. Similarly, the extension 123 of the transparent electrode 93 and the extension 132 of the second electrode 112 are superposed on the substrate 7 and thus electrically connected. The extension 121 of the transparent electrode 91 of the first photovoltaic region 81 has a connecting portion 141 of the same material as that of the second electrodes 111, 112 and 113 formed thereon. Accordingly, a photoelectromotive force generated at the respective photovoltaic regions 81, 82 and 83 of the photovoltaic device is withdrawn from the connecting portion 111 and the extension 133 in an electrically series fashion.

Now referring to FIGS. 2, 3 and 4, a method of manufacturing the same will be described. At the outset a light transmissive insulating substrate 7 made of glass, for example, and having flat surfaces is prepared. Then transparent electrodes 91, 92 and 93 for the photovoltaic regions 81, 82 and 83, respectively, are formed on one main surface of the substrate 7. It goes without saying that on that occasion the respective extensions 121, 122 and 123 are also formed at the same time. The transparent electrodes 91, 92 and 93 and the extensions 121, 122 and 123 may be formed of the above described materials by means of selective etching, selective evaporation or selective sputtering. The substrate 7 on which the transparent electrodes 91, 92 and 93 are thus formed is placed in an atmosphere of a silicon compound such as silane, silocon fluoride or the like and is then subjected to glow discharge. On that occasion impurities for the P layer and the $N^+$ layer are mixed in the gas atmospere at the same time. As seen from FIG. 2 in particular, it is imperative that the amorphous silicon layer 10 should not exist on the extensions 121, 122 and 123 of the respective electrodes. To that end, an approach wherein after formation of the amorphous silicon layer 10 on the whole surface of the substrate 7 an unnecessary portion is removed by selective etching thereby to leave only a necessary portion (the region as enclosed by the two dotted line in FIG. 2), an approach wherein only a necessary portion is formed using a mask covering an unnecessary portion, and the like may be considered. Finally, the second electrodes 111, 112 and 113 and the extensions thereof 131, 132 and 113 are formed simultaneously using the above described material such as aluminum, chrominum or the like and by means of selective evaporation or the like. On that occasion the connecting portion 141 is also formed at the same time on the extension 121.

If and when a light beam impinges on the other main surface of the light transmissive insulating substrate 7 of the photovoltaic device thus fabricated, the light beam is transmitted through the substrate 7 and the transparent electrodes 91, 92 and 93 to the amorphous silicon layer 10, so that, as in case of the FIG. 1 device, electrons and holes are generated in the amorphous silicon layer 10 at the respective photovoltaic regions or photoelectric converting regions 81, 82 and 83. The electrons or holes generated responsive to the incident light beam are gathered by paired electrodes 91 and 111, 92 and 112, and 93 and 113. However, since the extension 131 of the second electrode 111 and the extension 112 of the transparent electrode 92 are connected and the extension 132 of the second electrode 112 and the extension 123 of the transparent electrode 93 are connected, the photoelectromotive force generated at the respective photovoltaic regions 81, 82 and 83 is summed up in series. The photoelectromotive force thus summed up in series is withdrawn via the connecting portion 141 formed on the extension 121 of the transparent electrode 91 serving as a positive electrode and the extension 133 of the second electrode 113 serving as a negative electrode.

The connecting portion 141 formed on the extension 121 advantageously functions if and when an external connection lead is to be connected thereto. More specifically, although it is difficult to connect an external lead wire to the extension 121 of the transparent electrode 91 by means of ultrasonic bonding, for example, provision of the connecting portion 141 facilitates such connection of an external lead wire.

According to the embodiment shown in FIGS. 2 to 4, it is possible to withdraw an electromotive force of an increased voltage from one module or device. The reason is that an amorphous silicon layer is used as a semiconductor material contributing to photoelectric conversion and a plurality of photoelectric converting regions are formed on the same substrate such that a photoelectromotive force generated at the respective photoelectric converting regions may be withdrawn in an electrically series fashion. Since the semiconductor layer, i.e., the amorphous silicon layer is formed continuously and in common to the respective regions, in forming a plurality of photoelectric converting regions on one substrate, it is not necessary to isolate the respective photoelectric converting regions, which makes it possible to fabricate the inventive device with an extremely simple process with excellent mass productivity. Although it is necessary to form light transmissive electrodes on one surface of the amorphous silicon layer 10, formation of the transparent electrodes 91, 92 and 93 on the insulating substrate 7 as depicted with reference to the embodiment shown eliminates necessity of forming an oxide film on the amorphous silicon layer, thereby causing very little damage the amorphous silicon layer 10. As a result, the conversion efficiency of the inventive device is very little degraded. In addition, since it is possible to form the transparent electrodes 91, 92 and 93 on the substrate 7 with a simple process such as selective etching, selective evaporation, selective sputtering, or the like, the mass productivity is excellent.

Meanwhile, since in the photovoltaic device of the embodiment shown in FIGS. 2 to 4 the amorphous silicon layer 10 has been formed continuously and in common with the respective photoelectric converting regions 81, 82 and 83, too small a distance d between the adjacent regions 81, 82 and 83 could cause a leakage current between the respective photoelectric converting region. However, in view of the fact that the amorphous silicon layer 10, even if subjected to an incident light beam, has a resistance value of approximately $10^{4-5}\Omega$, the influence of such leakage current can be substantially eliminated by selecting the distance d between the adjacent photoelectric converting regions to be 1 μm.

Furthermore, it is pointed out that the distance d may be larger than at least the thickness of the amorphous silicon layer 10. The thickness of the amorphous silicon layer 10 may be arbitrarily selected within the range of 500 Å to 20 μm as described previously. Accordingly, the distance d may be selected to be larger than 500 Å to 20 μm.

However, as will be shown below it is possible to effectively suppress such a leakage current, thereby enhancing the conversion efficiency of the device as a whole.

Figure 5:
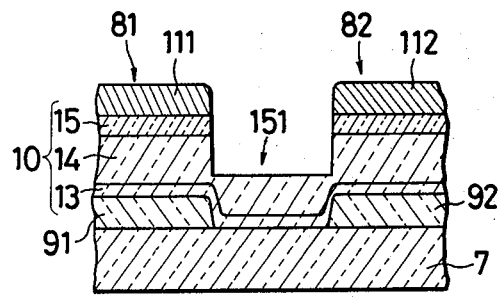
FIG. 5 is a sectional view showing a major portion of another embodiment of the present invention.

FIG. 5 is a sectional view showing a major portion of another embodiment of the present invention. The FIG. 5 embodiment is shown having a surface portion of the amorphous silicon layer 10 being removed at the areas between the adjacent photovoltaic regions. More specifically, the amorphous silicon layer 10 comprising the P type layer 13, the intrinsic layer 14 and the N+ layer 15 is formed with grooves 151 at the regions between the adjacent photoelectric converting regions 81 and 82. As a result, the resistance between the transparent electrodes 91 and 92 of the adjacent photoelectric converting regions 81 and 82 and/or the resistance between the second electrodes 111 and 112 are increased, with the result that the above described leakage current is suppressed. In order to form such grooves 151, one approach could employ selective etching using a particular mask for forming grooves 151, but in the embodiment shown, the second electrodes 111 and 112 may be used as a mask. Accordingly, a special mask is not required in forming grooves 151 in the embodiment shown.

Another approach for forming the grooves 151 is reverse sputtering. More specifically, the FIG. 4 composite is placed on a ground electrode such as a cathode in a high frequency electric field of an argon atmosphere. The argon atmosphere forms a plasma, so that ionized argon atoms bombard the surface of the composite. On that occasion, since the second electrodes 111 and 112 serving as a mask are made of metal and are difficult to be reverse sputtered as compared with the amorphous silicon layer 10, only the amorphous silicon layer between the regions 82 and 83 as exposed by the second electrodes 111 and 112 is removed from the surface, so that the grooves 151 as shown in FIG. 5 are formed. Such grooves 151 can be formed as fully aligned to the end portions of the second electrodes 111 and 112.

A further approach for forming the grooves 151 may be plasma etching. For example, a gas atmosphere of $CF_4+O_2$, $CF_4+N_2$ or $CF_2Cl_2$ at a pressure of 0.1 to 1 Torr is prepared and the photovoltaic device as shown in FIGS. 2 to 4 is placed in such a gas atmosphere. Then the device is subjected to a high frequency electric field of power density of 0.05 to 1 W/cm², for example. The gas atmosphere forms a plasma, so that active ionized fluorine atoms are generated. Such fluorine atoms exhibit a particularly strong etching function to the amorphous silicon and accordingly the grooves 151 are formed such that the end portions of the grooves 151 may be aligned with the end portions of the second electrodes 111 and 112. The etching rate by means of such plasma etching may be 200 to 500° Å/minute.

Although the above described reverse sputtering and plasma etching both involve the step of forming a plasma, the process would be of the same type as that of forming the amorphous silicon layer 10 and therefore such reverse sputtering and plasma etching are particularly preferred. Furthermore, the depth of the grooves 151 shown in FIG. 5 may be properly determined as necessary. Accordingly, depending on the case, the grooves 151 of the amorphous silicon layer 10 may be as deep so as to substantially sever the amorphous silicon layer 10. As described previously, the amorphous silicon layer 10 comprises the P type layer 13, the intrinsic layer 14 and the N+ layer 15. Accordingly, it should be appreciated that even a depth of the grooves 151 sufficient to sever at least the N+ layer 15 of a high impurity concentration would be effective. Thus, according to the embodiment shown, since the second electrodes are utilized as a mask for forming the grooves 151, a separate step of forming a mask for defining the above described grooves 151 is not required and hence the mass productivity is improved and the precision is enhanced.

Furthermore, in order to suppress leakage current through the amorphous silicon layer 10 at the areas between the respective photovoltaic regions, the following approach may be further employed.

Figure 6:
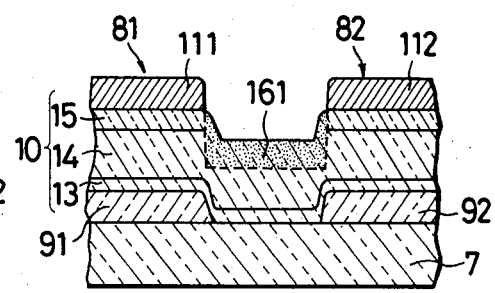
FIG. 6 is a sectional view showing a major portion of a further embodiment of the present invention.

FIG. 6 is a sectional view showing a major portion of a further embodiment of the present invention. The embodiment shown is characterized by a change in property of at least the portion of the amorphous silicon layer 10 of the areas between the respective photoelectric converting regions. For example, the amorphous silicon layer 10 between the photoelectric converting regions 81 and 82 may be converted to an insulating layer 161 such as an oxide or nitride. Accordingly, a substantial thickness of the amorphous silicon layer 10 at that portion is decreased and accordingly leakage current between the photoelectric converting regions 81 and 82 may be suppressed.

One possible approach for forming such an insulating layer 161 is an ion implantation process. More specifically, oxygen or nitrogen is implanted into the amorphous silicon layer of the areas between the respective photoelectric converting regions by means of an ion implantation process, whereby a portion of the amorphous silicon layer of such areas may be partially or wholly changed to an insulator. In the case where the atoms being implanted are of oxygen, a portion of the amorphous silicon of that areas is changed to $SiO_x$. On the other hand, if the atoms being implanted are of nitrogen, the amorphous silicon of such areas is converted into $SiN_x$. Additionally, fluorine atoms may also be implanted. In performing such ion implantation, a great advantage is that the second electrodes 111 and 112 may be used as a mask for selective ion implantation without employing a separate mask therefor.

Another approach for forming such an insulating layer 161 is a process of thermally oxidizing the above described portion of the amorphous silicon layer in an atmosphere of oxygen gas, steam, or the like, thereby to change the amorphous silicon to oxide. Alternatively, the above described portion of the amorphous silicon layer may be changed to nitride by heating the amorphous silicon layer in an atmosphere of nitrogen gas, ammonia gas or the like. In either case, the second electrode 111 and 112 may be utilized as a mask for oxidation or nitridation, as described previously.

Another approach to form an insulating layer 161 is to expose the above described device to a plasma atmosphere including an oxidizing gas or a nitriding gas. For example, a high frequency electric field having a field density of 0.03 to 0.5 W/cm$^2$ is applied to $O_2$ or $N_2$ of 0.1 to 1.0 Torr., for example, thereby to change the atmosphere to a plasma state. The device as shown in FIGS. 2 to 4 is then exposed to such an atmosphere. Then the portion of the amorphous silicon layer 10 between the photoelectric converting regions not covered with the second electrodes 111 and 112 is changed to an oxide or nitride. Each on that occasion the second electrodes 111 and 112 may be utilized as a mask for selecting the regions to be converted.

The depth of the insulating layer 161 may be determined as necessary and depending on the insulating layer 161 may be formed deep enough to substantially reach the substrate 7. However, it is sufficiently effective if the insulation layer 161 is so deep as to sever only the N$^+$ layer of high impurity concentration.

Thus, by forming the grooves 151 (FIG. 5) or the insulating layers 161 (FIG. 6) in the amorphous silicon layer formed continuously and in common to the respective photovoltaic regions or the photoelectric converting regions, it is possible to select the ratio of the resistance contributing to the leak current with respect to the internal resistance of the photoelectric converting regions per se to be sufficiently large whereby the leakage current is effectively suppressed.

Figure 7A:
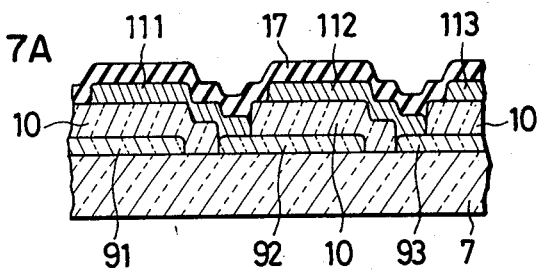
FIG. 7A is a sectional view showing still a further embodiment of the present invention.
Figure 7B:
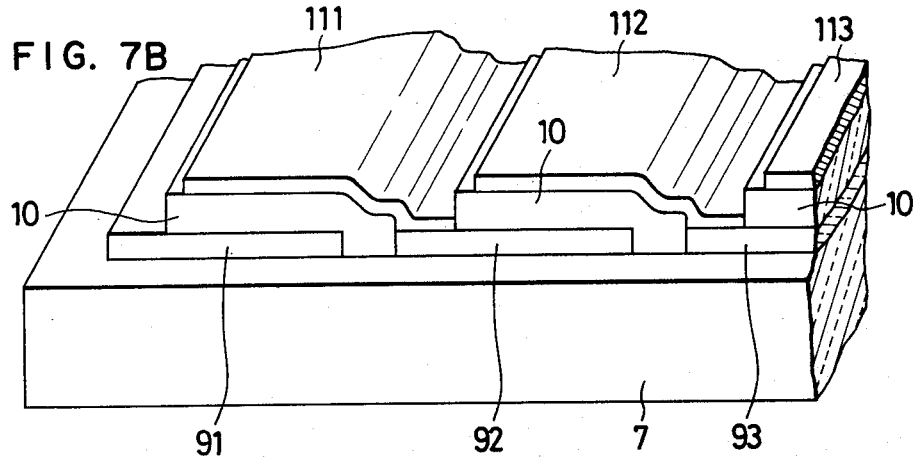
FIG. 7B is a perspective view showing a portion of the FIG. 7A embodiment.

FIG. 7A is a sectional view showing a still further embodiment of the present invention. FIG 7B is a diagrammatic perspective view showing a portion of the FIG. 7A embodiment, wherein the protecting layer 17 is omitted from the illustration. The embodiment shown is characterized by formation of an insulating film 17. Formation of the insulating film 17 increases the mechanical strength of the photovoltaic device and at the same time completely shields the second electrodes 111, 112 and 113 and the amorphous silicon layer 10 from the atmosphere, thereby protecting the same from moisture, corrosive gas, dust and the like. Such insulating film 17 can be formed by means of plasma sputtering in a glow discharge in an atmosphere including silane and oxygen or nitrogen gas, the reactive sputtering of a silica glass in an atmosphere including argon and oxygen or nitrogen gas, and the like.

In the foregoing the embodiments shown in FIGS. 2 to 6 were described as structured such that the transparent electrodes and the second electrodes of the adjacent photoelectric converting regions are electrically connected through a portion of the end portions of the elements. In such a case, a large current is concentrated at the end portion of each transparent electrode and second electrode including the connecting portion, particularly in the case of a device having a large current, which increases the series resistance component and accordingly degrades the characteristics of the photovoltaic device. Therefore, in the embodiments shown in FIGS. 7A and 7B and subsequently depicted with reference to FIG. 8, the amorphous silicon layer 10 is isolated so as to correspond to the respective transparent electrodes and the second electrodes and electrical connection is achieved between the adjacent amorphous silicon layers 10 through superposition of the second electrodes and the adjacent transparent electrodes. Furthermore, such connection is formed throughout approximately the full length in the width direction of the photovoltaic device (amorphous silicon layer 10). With such a structure, cascade connection between the adjacent photoelectric converting regions may be broader than the embodiment shown in FIGS. 2 to 6. As a result, according to the embodiment shown, a current is not concentrated at the end portion and the series resistance component at that portion is small, with the result that a photovoltaic device of an excellent characteristic is obtained. Accordingly, a photovoltaic device capable of withdrawing a larger current is provided.

For example, assuming that in the case of a structure of the FIGS. 2 to 6 embodiment the size of the photovoltaic device is selected to be 35 mm×35 mm and the joining area of the junction between the transparent electrodes and the second electrodes is selected to be 0.9 mm$^2$, then a photoelectric conversion efficiency of the photovoltaic device in such a situation is 2.5%. By constrast, according to the embodiment shown in FIGS. 7A, 7B and 8, the joining area between the adjacent transparent electrodes and second electrodes may be increased to 3.9 mm$^2$, and accordingly the photoelectric conversion efficiency may be increased to 3.5% even for a photovoltaic device of the same size.

Figure 8:
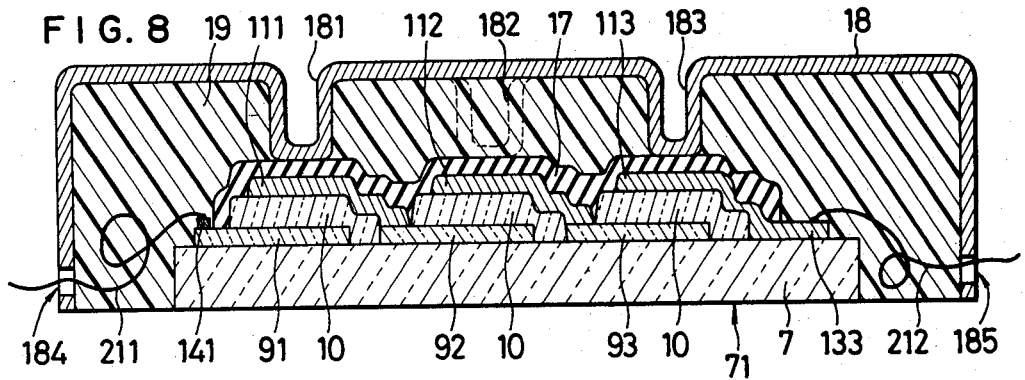
FIG. 8 is a sectional view of still another embodiment of the present invention.

FIG. 8 is a sectional view showing still a further embodiment of the present invention. The embodiment shown is characterized by provision of a casing 18 enclosing the device and a resin layer 19 between the casing 18 and the device. The casing 18 is made of an electrically conductive material such as aluminum, the bottom surface of which is formed of a proper number of (in the embodiment shown three) protrusions 181, 182 and 183. The glass substrate 7 having the photovoltaic regions or photoelectric converting regions forming on one main surface thereof is disposed in the casing 18 formed of such protrusions 181, 182 and 183, such that the insulating layer 17 is in contact with the protrusions 181, 182 and 183. Thereafter insulating resin such as epoxy resin is filled between the casing 18 and the device, thereby to form a resin layer 19. Accordingly, the device is mounted in the casing 18, with the other main surface 71 of the substrate 7 serving as a light receiving surface being coplaner with the opening surface of the casing 18.

The casing 18 is formed in advance with apertures 184 and 185 on the side surfaces thereof and an external lead wire 211 connected to the connecting portion 141 and an external lead wire 212 connected to the extension 133 are withdrawn through the apertures 184 and 185. It goes without saying that the external lead wires 211 and 212 are in contact with and embedded by the resin layer 19 in the casing 18. Thus, the device is housed in the casing and encapsulated, whereby mechanical strength of the device is increased and protection of the device from the atmosphere is more enhanced, with the result that a reliability of the device is considerably enhanced.

Figure 9:
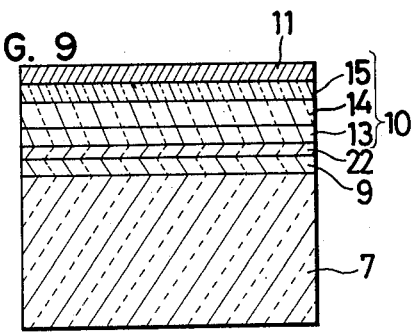
FIG. 9 is a view showing a principle of still a further embodiment of the present invention.

FIG. 9 is a sectional view of the portion of still a further embodiment of the present invention. The embodiment shown is characterized by formation of a transparent insulating film 22 between the transparent electrode 9 and the amorphous silicon layer 10. The transparent insulating film 22 can effectively prevent mutual diffusion among the layer 10 and the transparent electrode 9 on the occasion of formation of the amorphous silicon layer 10. More specifically, after the transparent electrode 9 is formed on the light transmissive insulating substrate 7, the amorphous silicon layer 10 is then formed, during which the substrate 7 need be maintained at approximately 300° C. for one to two hours. Accordingly, mutual diffusion could occur between the already formed transparent electrode 9 and the amorphous silicon layer 10 being formed and such mutual diffusion results in a considerable reduction of the short circuit current (Isc). In particular, such mutual diffusion is conspicuous, when the transparent electrode 9 is being formed using indium tin oxide ($In_2O_3 + SnO_2$), when the amorphous silicon layer in electrical contact with the transparent electorde 9 is a P type layer, and the like. Therefore, in the embodiment shown, a transparent insulating film 22 is interposed between the transparent electrode 9 and the amorphous silicon layer 10, in order to prevent such mutual diffusion.

Preferably the above described transparent insulating film 22 may be formed of silicon oxide (SiO, $SiO_2$), silicon nitride ($Si_3N_4$) or the like. The transparent insulating film 22 is formed several to several tens of Å thick, inasmuch as conductivity must be maintained to some extent between the transparent electrode 9 and the amorphous silicon layer 10. Such transparent insulating film 22 can be formed through glow discharge in an atmosphere of silane gas including oxygen or nitrogen.

After the transparent insulating film 22 is thus formed, the amorphous silicon layer 10 is formed, the temperature of forming the amorphous silicon layer 10 being approximately 300° C. However, since the transparent insulating film 22 is very stable, very little mutual diffusion occurs between the transparent electrode 9 and the amorphous silicon layer 10. After the device is thus fabricated, the electrons and/or holes of the free state which have been produced in the amorphous silicon layer 10 can be transported through the transparent insulating film 22 to the transparent electrode 9. Accordingly, it should be appreciated that the thickness of the transparent insulating film 22 must be such that sufficient electrons in said free state can penetrate therethrough.

The photovoltaic device thus fabricated can provide photoelectromotive force with a given photoelectric conversion efficiency responsive to incident radiation coming from the other main surface of the glass substrate 7. Also, the inventors of the present invention have observed that the inventive photovoltaic device using amorphous silicon provides a conspicuous difference in the conversion efficiency between the case where solar radiation impinges thereupon and the case where radiation from a fluorescent lamp impinges thereupon; and the conversion efficiency for the radiation coming from a fluorescent lamp is better than that for solar radiation. Presently such difference in the conversion efficiency cannot be theoretically accounted for, in spite of the fact that the spectral distribution characteristics of solar radiation and the radiation from fluorescent lamp are substantially the same. Furthermore, in the case of fluorescent lamp radiation, a device using amorphous silicon exhibits a higher conversion efficiency as compared with a device using single crystal silicon. The reason is presumably that amorphous silicon has a larger width of the forbidden band as compared with single crystal silicon, which causes the sensitivity peak to be shifted toward shorter wavelengths, and such sensitivity peak of the device using amorphous silicon coincides with a peak of a spectral distribution of the radiation from a fluorescent lamp.

Figure 10:
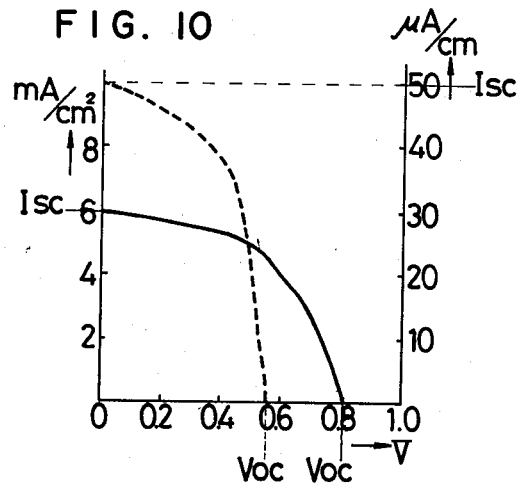
FIG. 10 is a graph showing one example of the output characteristic of a photovoltaic device in accordance with the present invention, wherein the abscissa indicates voltage and the ordinate indicates current.

FIG. 10 is a graph showing a difference in the output characteristics due to a difference in such incident radiation, wherein the abscissa indicates an output voltage, the right side ordinate indicates output current in case of incidence of radiation from a fluorescent lamp and the left side ordinate indicates output current in case of incidence of solar radiation. It is pointed out that the FIG. 10 characteristic shows that of only one converting region and hence the overall characteristic of the inventive device exhibits an accumulated voltage characteristic determined by the number of converting regions as series connected. Referring to FIG. 10, the solid line indicates incidence of solar radiation and the dotted line indicates incidence of radiation from a fluorescent lamp. In the above described experimentation a fluorescent lamp of 400 lux was employed, while solar radiation (air mass 1:AMl) was of 100 mW/cm$^2$. As seen from FIG. 10, the photovoltaic characteristic conversion characteristics in the case of incidence of solar radiation are: open voltage (Voc)=0.8 V, short circuit current (Isc)=6 mA/cm$^2$, fill factor (FF)=0.5 and conversion effeciency ($\eta$)=2.4%. By contrast, in the case of incidence of radiation from a fluorescent lamp upon the same device, Voc=0.55 V, Isc=50 $\mu$A/cm$^2$, FF=0.54, with the output power on that occasion being 15 $\mu$W/cm$^2$. The output power in the case of incidence of radiation from a fluorescent lamp under the same condition upon a photovoltaic device using conventional single crystal silicon having the same light receiving area was approximately 7 $\mu$W/cm$^2$. From the foregoing description, it should be appreciated that the inventive photovoltaic device using amorphous silicon is particularly effective in the case of incidence of radiation from a fluorescent lamp. Therefore, it follows that the best use is made of the inventive photovoltaic device if and when the device is used as a power supply of a small size electronic apparatus mainly used indoors. More specifically, indoor illumination is in most cases attained by fluorescent lamps and accordingly the inventive device can be most advantageously used as a power supply of small sized electronic apparatus which are most used indoor. As examples of such small sized electronic apparatuses, electronic pocketable calculators, electronic clocks, watches and the like may be enumerated.

Figure 11:
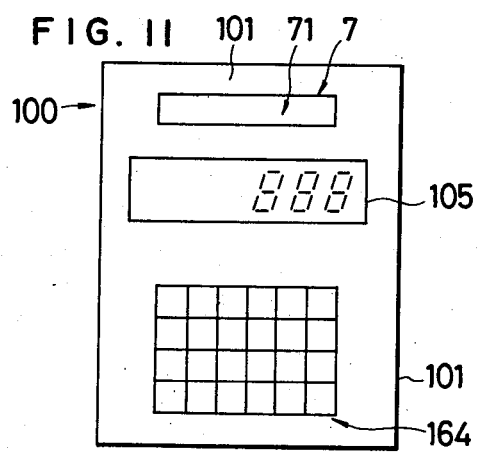
FIG. 11 is a diagrammatic view showing one example of an electronic pocket calculator which is one of the preferred applications of the inventive device.
Figure 12:
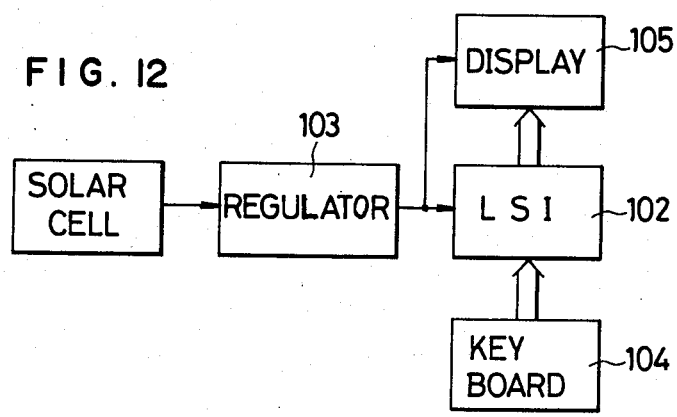
FIG. 12 is a block diagram showing one example of a circuit configuration of the FIG. 12 electronic pocket calculator.

FIG. 11 is a diagrammatic view of one example of an electronic pocketable calculator as a preferred embodiment of the present invention. Referring to FIG. 11, the electronic pocketable calculator 100 comprises a housing 101. Although not shown in the figure, the housing 101 is structured to house a large scale integrated circuit element 102 as shown in FIG. 12, a stabilizing circuit 103 for stabilizing the output voltage from the photovoltaic device, and the like. As is well-known, the calculator further comprises a keyboard 104, a display 105 and the like mounted to be exposed from the housing 101. The photovoltaic device or solar cell as previously described in conjunction with FIGS. 2 to 9 is also mounted in the housing 101 so that the light receiving surface 71 of the substrate 7 of the device may be exposed through the housing 101. The photovoltaic regions or photoelectric converting regions formed on the rear surface of the substrate 7 are located within the housing 101. Now as shown in FIG. 12, the output voltage from the photovoltaic device or solar cell is applied as a power supply through the stabilizing circuit 103 to the large scale integrated circuit 102, the display 105 and the like. Alternatively, power thus obtained from the inventive photovoltaic device may be stored in a rechargeable battery, so that the power may be applied from the rechargeable battery to the respective components 102, 105 and the like.

According to the present invention, a plurality of photoelectric converting regions are formed in one module, so that the photoelectromotive force from the respective photoelectric converting regions may be withdrawn in an electrical series fashion. Therefore, even an electronic pocketable calculator can be sufficiently energized. More specifically, although three photoelectric converting regions were included in the embodiment shown, the number of such photoelectric converting regions may be suitably increased depending on the magnitude of a source voltage required. For example, in the case of a certain type of electronic pocketable calculator, the rated power supply is 3 V, 6 $\mu$A and 18 $\mu$W. On the other hand, the open circuit voltage Voc of one converting region of such a photovoltaic device as attained by the present invention is approximately 0.55 V, the output power being approximately 15 $\mu$W/cm². Accordingly, assuming that the inventive photovoltaic device is used as a power supply of such an electronic pocketable calculator, then a light receiving area of approximately 1.2 cm² is required. Furthermore, described in terms of voltage, the number of photoelectric converting regions as required is eight stages. In this case, the area of one photoelectric converting region is 0.15 cm². Assuming that a device of the same requirements as the inventive device is fabricated using conventional single crystal silicon, it should be appreciated that the open circuit voltage Voc for one photoelectric converting region of a device using single crystal silicon is approximately 0.33 V, the output power being approximately 7 $\mu$W/cm² and therefore the required light receiving area must be very large as compared with approximately 1.2 cm² when the inventive device is employed.

Figure 13:
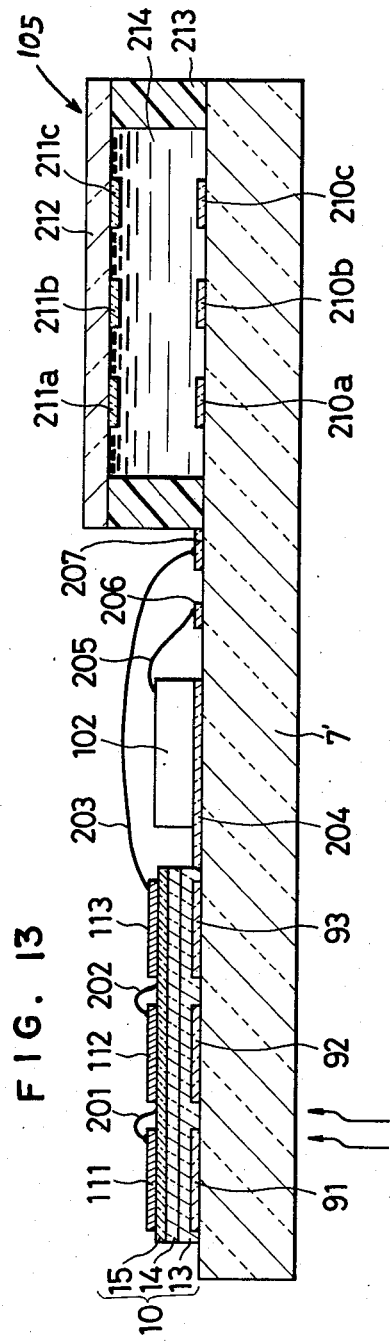
FIG. 13 is a cross sectional view showing a further preferred embodiment of the present invention.

FIG. 13 is a diagrammatic cross sectional view showing a portion of an electronic apparatus with a display employing the inventive photovoltaic device. The embodiment shown is characterized by a common utilization of a single glass substrate 7' as a transparent insulating substrate for a photovoltaic device constituting a power supply and as a transparent substrate for a display 105. More specifically, the display 105 shown in FIG. 12, for example, is structured as a liquid crystal display. As is well-known to those skilled in the art, a liquid crystal display comprises a transparent insulating substrate and a transparent electrode formed thereon. A preferred embodiment of the inventive photovoltaic device also comprises a transparent insulating substrate on which a transparent electrode is formed. Thus, since both the device and the display require a transparent insulating substrate and a transparent electrode formed thereon, a substrate 7' is commonly used for the purpose of simplification of the structure and the manufacturing process.

The photovoltaic device corresponding to the FIG. 12 solar cell, for example, comprises a glass substrate 7' and transparent electrodes 91, 92 and 93, an amorphous silicon layer 10 and second electrodes 111, 112 and 113 formed thereon, as in case of the FIG. 2 device. Upon incidence of radiation through the glass substrate 7' and the transparent electrodes 91, 92 and 93 on the amorphous silicon layer 10, electrons and/or holes of a free state are generated mainly in the intrinsic layer 14 and are moved as a function of the electric field of the PIN junction in the amorphous silicon layer 10 to be collected to the corresponding transparent electrodes and the second electrodes, respectively.

Accordingly, a voltage is generated between the opposing transparent electrodes and the second electrodes. The second electrode 111 and the transparent electrode 92, and the second electrode 112 and the transparent electrode 93 are connected by means of metallic lead wires 201 and 202, respectively. Accordingly, the voltages of the respective photoelectric converting regions of the inventive photovoltaic device are added in series and the voltage thus summed up in series is withdrawn with the transparent electrode 91 serving as the positive electrode and the second second electrode 113 serving as the negative electrode.

A large scale integrated circuit chip 102 as shown in FIG. 12 is mounted on the substrate 7'. The chip 102 is electrically connected and fixed to an electrically conductive pattern 204 formed on the substrate 7'. The electrically conductive pattern 204 is electrically connected to the transparent electrode 91, although not shown.

The liquid crystal display 105 comprises a display cell portion comprising the common glass substrate 7', a glass cover 212 and a spacer 213, wherein a liquid crystal 214 is filled therebetween at a display cell portion. Transparent electrodes 210a, 210b, 210c, and so on are formed on the substrate 7' as an arrangement of segments in the letter shape "8", for example. Transparent electrodes 211a, 211b, 211c and so on are formed so as to face transparent electrodes 210a, 210b, 210c and so on, respectively, on the glass cover 212. Reference characters 206 and 207 denote electrically conductive runs formed on the substrate 7', wherein one electrically conductive run 206 is electrically connected to the transparent electrodes 211a, 211b, 211c and so on while the other electrically conductive run 207 is electrically connected to the transparent electrodes 210a, 210b, 210c and so on. The electrically conductive run 206 is connected through a metallic lead wire 205 to the large scale integrated circuit 102 for display driving while the electrically conductive run 207 is connected through the metallic lead wire 203 to the second electrode 113 of the photovoltaic device. Accordingly, the negative terminal of the voltage generated from the photovoltaic device is applied to the transparent electrodes 210a, 210b, 210c and so on, while the positive terminal of the voltage is applied through the large scale integrated circuit 102 to the transparent electrodes 211a, 211b, 211c and so on. By switching the above described voltage by means of the large scale integrated circuit 102 in association with information or characters being displayed any desired characters can be displayed by the liquied crystal display 105 through proper selection of the respective electrodes 210a, 210b, 210c and so on and 211a, 211b, 211c and so on.

Although in the FIG. 13 embodiment the adjacent transparent electrodes and second electrodes are electrically connected by means of the metallic lead wires 201, 202, it goes without saying that these may be directly connected as depicted with reference to FIGS. 2 to 4. The number of photoelectric converting regions being series connected may also be suitably increased as necessary and a power supply for the display driving large scale integrated circuit 102 per se may also be obtained from the above described photovoltaic device or soler cell. Furthermore, the electrically conductive runs 204, 206, 207 and the displaying transparent electrodes 210a, 210b, 210c and the transparent electrodes 91, 92 and 93 may also be formed through substantially the same process using the same material. According to the FIG. 13 embodiment the liquid crystal display 105 is obtained as the so-called transmission type but the same may be structured as the so-called reflection type by forming a light reflective film on the outer surface of the glass cover 10. In case of the latter type, the surface of the substrate 7' is a display surface.

Such a device as shown in FIG. 13 may be fabricated in the following manner. First the common glass substrate 7' is prepared and the electrodes 91, 92, 93, 210a, 210b, 210c and the electrically conductive runs 204, 206, 207 are formed simultaneously on the glass substrate 7'. Then a portions for the photovoltaic device, the liquid crystal display 105 and the large scale integrated circuit 102 are sequentially formed and the just mentioned components mounted thereon and then electrical connection is made using suitable metallic lead wires, as necessary.

Figure 14:
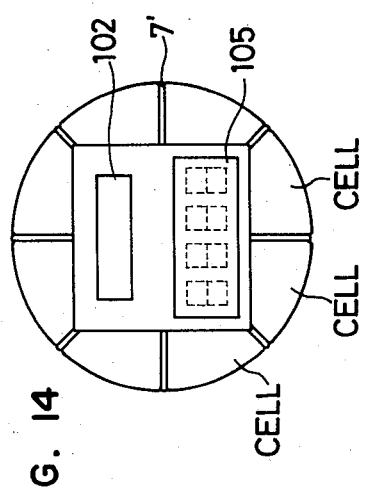
FIG. 14 is a plan view showing a modification of the FIG. 13 embodiment.

FIG. 14 is a plan view showing another preferred embodiment of the present invention which is applied to a wrist watch. The embodiment shown employs a common glass substrate 7' of a circular shape. The circular glass substrate 7' is used such that the liquid crystal display 105 and the driving large scale integrated circuit 102 are disposed at the central portion of the surface of the substrate 7' and at the same time the photoelectric converting regions are disposed therearound. In such a case, the rear surface of the glass substrate 7' is a light impinging and displaying surface.

According to the embodiments shown in FIG. 13 and 14, since a common glass substrate is employed, the structure of the device becomes simple. Furthermore, since the process for forming the transparent electrodes may be of one step, the fabricating step can be simplified. Although in the above described embodiments shown in FIGS. 13 and 14 a liquid crystal device was utilized as a display, likewise an electric field display such as an EL (electroluminescent) display, an ECD (electrochromic) display and others requiring a transparent substrate may be utilized.

Although in the foregoing several embodiments were described, it should be understood that various changes and modifications can be made by those skilled in the art with ease. For example, instead of employing a PIN junction as the amorphous silicon layer structure, a Schottky juntion or heterojunction may be utilized to implement the inventive device. Referring again to FIG. 9, the present invention can be applied even to a type of a heterojunction in which a transparent insulating film is sandwiched as in case of the FIG. 9 embodiment. More specifically, in the FIG. 9 embodiment, the amorphous silicon layer is formed only as an N type layer, while a heterojunction may be formed with a transparent electrode 9, a transparent insulating film 22 and an N type amorphous silicon layer, so that a photoelectromotive force is similarly generated. In such case as well, mutual diffusion between the transparent electrode 9 and the amorphous silicon layer does not occur.

Furthermore, although the above described embodiments were structured such that radiation is caused to impinge from the other main surface of the glass substrate, the device could be structured such that radiation is caused to impinge through the second electrode and the insulating film by fabricating the second electrodes 111, 112 and 113 and the insulating film 17 (FIGS. 7 and 8) with a light transmissive material. Also, in such a case, it would not be necessarily required that the substrate 7 and the electrodes 91, 92 and 93 be light transmissive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device including a plurality of photoelectric converting regions, comprising:
   a substrate of insulating material,
   a unitary and continuous amorphous silicon layer formed on said insulating substrate and forming a plurality of spaced photoelectric converting regions,
   a pair of electrodes provided in each said photoelectric converting region, the respective electrodes of each pair opposing each other with said unitary amorphous silicon layer therebetween, at least one electrode of each said pair of electrodes being of a radiation transmissive material,
   each electrode of a said pair of electrodes of a photoelectric converting region having an extension extending outward of said amorphous silicon layer, and
   means for electrically connecting corresponding ones of said extensions of said respective electrodes of said plurality of photoelectric converting regions in series for withdrawing photoelectromotive force of said plurality of photoelectric converting regions in electrical series fashion.

2. A photovoltaic device in accordance with claim 1, wherein
   said unitary amorphous silicon layer comprises a layered structure of a P-layer, I-layer and N-layer.

3. A photovoltaic device in accordance with claim 1, wherein said electrical connection means comprises a connecting portion formed on a portion of said extension of at least one said radiation transmissive electrode and being adapted for external connection.

4. A photovoltaic device in accordance with claim 3, wherein said connecting portion is made of the same material as that of the other electrode of a said pair of electrodes.

5. A photovoltaic device in accordance with claim 1, wherein said amorphous silicon layer is structured to generate said electrons or holes with higher efficiency when said radiation is caused to impinge from the direction of said insulating substrate, and said insulating substrate and the electrodes disposed on the radiation incident side of said device are both made of radiation transmissive material.

6. A photovoltaic device in accordance with claim 5, wherein said insulating substrate comprises a glass material.

7. A photovoltaic device in accordance with claim 5, wherein
said unitary amorphous silicon layer comprises a layered structure including a P-layer, I-layer and N-layer in the above described order from said insulating substrate.

8. A photovoltaic device in accordance with any one of claims 1, 2 or 5, wherein the electrode disposed on the radiation incident side of said device is made of a material selected from the group consisting of tin oxide ($SnO_2$), indium oxide ($In_2O_3$), and indium tin oxide ($In_2O_3 + SnO_2$).

9. A photovoltaic device in accordance with claim 1 or 5, further comprising a transparent insulating film between each said transparent electrode and said amorphous silicon layer.

10. A photovoltaic device in accordance with claim 9, wherein said transparent insulating film comprises silicon oxide.

11. A photovoltaic device in accordance with claim 9, wherein said transparent insulating film comprises silicon nitride.

12. A photovoltaic device in accordance with claim 1 wherein the portion of said amorphous silicon layer lying between and connecting adjacent photoelectric converting regions is formed to exhibit a resistance larger than a predetermined value.

13. A photovoltaic device in accordance with claim 12, wherein said connecting portion of said amporphous silicon layer is formed with a width larger than its thickness.

14. A photovoltaic device in accordance with claim 13, wherein the thickness of said continuous amorphous silicon layer is in the range of from about 500 A to about 200 µm.

15. A photovoltaic device in accordance with claim 13, wherein the width of said connecting portion is larger than 1 µm.

16. A photovoltaic device in accordance with claim 12 or 13, wherein said connecting portion of said continuous amorphous silicon layer has a portion thereof removed in the depth direction thereof.

17. A photovoltaic device in accordance with claim 16, wherein said connecting portion of said continuous amorphous silicon layer has a portion thereof removed to a given depth from the free or upper surface of said continuous amorphous silicon layer.

18. A photovoltaic device in accordance with claim 16, wherein said continuous amorphous silicon layer comprises at least a highly impurity doped layer for providing an ohmic contact with one of said pair of electrodes, and said connecting portion of said amorphous silicon layer has at least a portion of said highly impurity doped layer removed.

19. A photovoltaic device in accordance with claim 12 wherein said connecting portion of said continuous amorphous silicon layer is processed to be changed in property from the other portion of the layer forming the photoelectric converting regions such that the conductivity of that portion is decreased as compared to such other portion.

20. A photovoltaic device in accordance with claim 19, wherein said continuous amorphous silicon layer comprises at least a highly impurity doped layer for providing an ohmic contact with one of said pair of electrodes, and said property changing process is applied to at least a portion of said highly impurity doped layer.

21. A photovoltaic device in accordance with claim 1, wherein one electrode of each pair of electrodes is sandwiched between said insulating substrate and said continuous amorphous silicon layer and is fully covered by said amorphous silicon layer except at a peripheral edge of each said one electrode,
the other electrode of each said pair of electrodes is formed on said single amorphous silicon layer, said extensions of said other electrodes extending outward beyond the end of said amorphous silicon layer, whereby said extensions of said other electrodes and said peripheral edge of each said one electrode are isolated by said amorphous silicon layer.

22. A photovoltaic device in accordance with claim 1, wherein pairs of electrodes are separated in terms of the plane by a given spacing.

23. A photovoltaic device in accordance with either of claims 1 or 2, further comprising a protecting layer of an insulating material formed to cover said photoelectric converting regions from the side of the outer one of said pair of electrodes.

24. A photovoltaic device in accordance with claim 23, wherein said insulating material comprises silicon oxide or silicon nitride.

25. A photovoltaic device in accordance with claim 24, which further comprises
a casing for enclosing said photoelectric converting regions from the side of said outer electrode, and
an insulating material filled in said casing,
said electrical connection means connecting the the transparent electrode of each photoelectric converting region with the other electrode of an adjacent photoelectric converting region.

26. A photovoltaic device in accordance with claim 25, wherein said insulating material filling said casing comprises synthetic resin.

27. A photovoltaic device including a plurality of photoelectric converting regions, comprising:
a substrate of radiation transmissive and insulating material,
a plurality of transparent electrodes of a radiation transmissive material formed spaced apart from each other on said substrate,
a respective amorphous silicon layer formed on each of said plurality of transparent electrodes for generating charge carriers as a function of radiation impinging thereon through said substrate and said transparent electrodes,
one side of each said amorphous silicon layer being retracted inward from the corresponding side of the corresponding transparent electrode, to expose one side and an edge surface strip of each said transparent electrode,
a respective second electrode formed on each said amorphous silicon layer and forming an electrode pair with each said corresponding transparent electrode associated with a respective amorphous silicon layer,
one side of each said second electrode being retracted inwardly from the corresponding side of the corresponding amorphous silicon layer, the other side of each said second electrode extending beyond the corresponding other side of the corresponding amorphous silicon layer and being bent toward and lying juxtaposed on the exposed side and edge surface strip of the transparent electrode of the next adjacent photoelectric converting region, and means for electrically connecting one said second electrode to the exposed side and edge surface strip of the transparent electrode of the next adjacent photoelectric converting region for withdrawing photoelectromotive force of each said photoelectric converting regions in a series fashion.

28. A photovoltaic device in accordance with claim 27, wherein said transparent electrodes and said second electrodes are each electrically connected along their full length in the width direction.

29. A photovoltaic device in accordance with claim 27, wherein said substrate comprises a glass material.

30. A photovoltaic device in accordance with claim 27, wherein said transparent electrodes are of a material selected from the group consisting of tin oxide ($SnO_2$), indium oxide ($In_2O_3$) and indium tin oxide ($In_2O_3 + SnO_2$).

31. A photovoltaic device in accordance with claim 27, which further comprises a connecting portion formed on said extension of at least one said transparent electrode and adapted for external connection, and said connecting portion being of the same material as that of said second electrode.

32. A photovoltaic device in accordance with claim 27, wherein the thickness of each said amorphous silicon layer is in the range of from about 500 Å to about 20 μm.

33. A photovoltaic device in accordance with claim 27, which further comprises a protecting layer of an insulating material for covering from the second electrode side the composite comprising said substrate, transparent electrodes, amorphous silicon layers and second electrodes, laminated in the above-described order.

34. A photovoltaic device in accordance with claim 33, wherein said insulating material is silicon oxide or silicon nitride.

35. A photovoltaic device in accordance with claim 33 or 34, which further comprises
a casing for enclosing from the second electrode side the composite of said transparent electrodes, said amorphous silicon layers and said second electrodes, and
an insulating material being filled within said casing.

36. A photovoltaic device in accordance with claim 35, wherein said insulating material filling said casing comprises synthetic resin.

37. A photovoltaic device in accordance with claim 27, wherein
the other side end of said amorphous silicon layer is extended outward beyond the other side end of said transparent electrode.

38. A photovoltaic device in accordance with claim 37 wherein
each said amorphous silicon layer comprises a layered structure including a P-layer, I-layer and N-layer layered in the above described order from said substrate.

39. A photovoltaic device in accordance with claim 38, wherein
said other side end of a said amorphous silicon layer is in contact with said one side of a said transparent electrode.

40. A photovoltaic device in accordance with any one of claims 27, 28, 30, 32 or 33, which further comprises a transparent insulating film formed between said transparent electrodes and said amorphous silicon layers.

41. A photovoltaic device in accordance with claim 40, wherein said transparent insulating film comprises silicon oxide.

42. A photovoltaic device in accordance with claim 40, wherein said transparent insulating film comprises silicon nitride.

43. A method for manufacturing a photovoltaic device having a plurality of photoelectric converting regions, comprising the steps of
preparing a radiation transmissive and insulating substrate,
forming a plurality of transparent electrodes on one major surface of said substrate spaced apart from each other with each said electrode located in a respective photoelectric converting region to be subsequently formed and having an extension extending from the respective region,
forming a continuous amorphous silicon layer comprising said photoelectric converting regions on said substrate for covering said plurality of transparent electrodes,
forming a plurality of second electrodes on said continuous amorphous silicon layer with each said second electrode having an extension which extends from said continuous layer and located within a said photoelectric converting region to form an electrode pair with the corresponding transparent electrode of said photoelectric converting region, and
electrically connecting said extension of each said transparent electrode to said extension of the second electrode of an adjacent photoelectric converting region.

44. A method for manufacturing a photovoltaic device in accordance with claim 43, wherein said step of preparing said substrate comprises the step of preparing a glass material.

45. A method for manufacturing a photovoltaic device in accordance with claim 43 or 44, wherein said step of forming said transparent electrodes comprises the step of
forming a transparent and electrically conductive layer serving as a transparent electrode on the whole surface on one main surface of said substrate, and
selectively etching said transparent electrically conductive layer into a predetermined pattern.

46. A method for manufacturing a photovoltaic device in accordance with claim 43 or 44, wherein said step of forming said transparent electrodes comprises the step of selectively evaporating a transparent electrically conductive material on said one main surface of said substrate.

47. A method for manufacturing a photovoltaic device in accordance with claim 43 or 44, wherein said step of forming said transparent electrodes comprises the step of selectively sputtering a transparent electrically conductive material on said one main surface of said substrate.

48. A method for manufacturing a photovoltaic device in accordance with claim 43, wherein said step of electrically connecting comprises the step of forming said extension of each said second electrode to overlay the extension of the transparent electrode of the next adjacent region.

49. A method for manufacturing a photovoltaic device in accordance with claim 43, wherein said step of forming said amorphous silicon layer comprises the steps of forming a P-layer, I-layer and N-layer in the described order.

50. A method for manufacturing a photovoltaic device in accordance with claim 43, which further comprises the step of removing a portion of said amorphous silicon layer lying between adjacent photoelectric converting regions.

51. A method for manufacturing a photovoltaic device in accordance with claim 50, wherein said step of removing at least a portion of said amorphous silicon layer comprises the step of removing at least a portion of said amorphous silicon layer lying between said adjacent photoelectric converting regions from the "free or upper" surface of said amorphous silicon layer using said second electrodes as a mask.

52. A method for manufacturing a photovoltaic device in accordance with claim 51, wherein said step of removing said amorphous silicon layer comprises the step of reverse sputtering using said second electrodes as a mask.

53. A method for manufacturing a photovoltaic device in accordance with claim 51, wherein said step of removing said amorphous silicon layer comprises the step of plasma etching using said second electrodes as a mask.

54. A method for manufacturing a photovoltaic device in accordance with claim 52 or 53, wherein said step of forming said amorphous silicon layer comprises the step of forming said amorphous silicon layer in a plasma atmosphere containing a silicon compound.

55. A method for manufacturing a photovoltaic device in accordance with claim 43, which further comprises the step of processing said amorphous silicon layer lying between said adjacent photoelectric converting regions for decreasing the conductivity thereof.

56. A method for manufacturing a photovoltaic device in accordance with claim 53, wherein said processing step comprises the step of ion implanting oxygen, nitrogen or fluorine in said amorphous silicon layer lying between said adjacent photoelectric converting regions using said second electrodes as a mask.

57. A method for manufacturing a photovoltaic device in accordance with claim 55, wherein said processing step comprises the step of heating the composite in an oxidizing atmosphere using said second electrodes as a mask.

58. A method for manufacturing a photovoltaic device in accordance with claim 55, wherein said processing step comprises the step of heating said amorphous silicon layer in a nitriding atmosphere using said second electrodes as a mask.

59. A method for manufacturing a photovoltaic device in accordance with claim 55, wherein said processing step comprises the step of exposing said amorphous silicon layer to an atmosphere including oxygen or nitrogen gas in a plasma state.

60. A method for manufacturing a photovoltaic device in accordance with claim 43, which further comprises the step of forming a transparent insulating film between said transparent electrodes and said amorphous silicon layer.

61. A method for manufacturing a photovoltaic device in accordance with claim 60, wherein said step of forming said transparent insulating film comprises the step of forming a silicon oxide film.

62. A method for manufacturing a photovoltaic device in accordance with claim 60, wherein said step of forming a transparent insulating film comprises the step of forming a silicon nitride film.

63. A power supply for an electronic apparatus, including a housing, and a circuit portion housed in said housing, comprising:
a radiation transmissive and insulating substrate explosable from said housing,
a plurality of transparent electrodes formed spaced apart from each other on the surface opposite to said exposed surface of said radiation transmissive and insulating substrate, each said transparent electrode having an extension extending outward from a predetermined region,
a continuous amorphous silicon layer formed on said respective transparent electrodes for covering said predetermined regions and in common to said plurality of transparent electrodes,
a plurality of spaced apart second electrodes formed on said amorphous silicon layer, each constituting a pair with each said corresponding transparent electrode and having an extension extending outward beyond said amorphous silicon layer,
electrical connection means for electrically connecting said extension of each said transparent electrode to said extension of each said second electrode, for series connecting said photoelectric converting regions, and
supplying means for supplying electromotive force to said circuit portion from said photoelectric converting regions as series connected by means of said electrical connecting means.

64. A power supply for an electronic apparatus, including a housing, and a circuit portion housed in said housing, comprising:
a radiation transmissive and insulating substrate explosable from said housing,
a plurality of transparent electrodes of a radiation transmissive material formed spaced apart from each other on said substrate,
a respective amorphous silicon layer formed on each of said plurality of transparent electrodes for generating charge carriers as a function of radiation impinging thereon through said substrate and said transparent electrodes,
one side of each said amorphous silicon layer being retracted inward from the corresponding side of the corresponding transparent electrode, to expose one side and an edge surface strip of each said transparent electrode,
a respective second electrode formed on each said amorphous silicon layer and forming an electrode pair with each said corresponding transparent electrode associated with a respective amorphous silicon layer,
one side of each said second electrode being retracted inwardly from the corresponding side of the corresponding amorphous silicon layer, the other side of each said second electrode extending beyond the corresponding other side of the corresponding amorphous silicon layer and being bent toward and lying juxtaposed on the exposed side and surface strip of the transparent electrode of the next adjacent photoelectric converting region, and
means for electrically connecting one said second electrode to the exposed side and edge surface strip of the transparent electrode of the next adjacent photoelectric converting region for withdrawing photoelectromotive force of each said photoelectric converting regions in a series fashion, and supplying means for supplying electromotive force to said circuit portion from said photoelectric converting regions as series connected by means of said electrical connecting means.

65. A power supply for an electronic apparatus in accordance with claim 62 or 64, wherein said supplying means further comprises voltage regulating means for stabilizing said electromotive force withdrawn from said withdrawing means for supplying stabilized output to said circuit portion.

66. A power supply for an electronic apparatus in accordance with claim 63 or 64, which further comprises a transparent insulating film formed between said transparent electrodes and said amorphous silicon layer.

67. A power supply for an electronic apparatus in accordance with any one of the preceding claims 63 or 64, wherein said amorphous silicon layer is formed to generate said photoelectromotive force with a better efficiency responsive to incidence of radiation from a fluorescent lamp than from solar radiation.

68. A method for manufacturing a photovoltaic device having a plurality of photoelectric converting regions, comprising the steps of
   preparing a radiation transmissive and insulating substrate,
   forming a plurality of transparent electrodes on one major surface of said substrate spaced apart from each other,
   forming a plurality of separate amorphous silicon layers on said respective transparent electrodes,
   one side end of each said amorphous silicon layer being retracted inward from the corresponding side end of each said corresponding transparent electrode, whereby one end of each said transparent electrode is exposed,
   forming a plurality of second electrodes on said respective amorphous silicon layers, each constituting a pair with each said corresponding transparent electrode,
   one side end of each said second electrode being retracted inward from the corresponding side end of each said corresponding amorphous silicon layer and the other side end of each said
   second electrode being extended outward beyond the corresponding side of each said corresponding amorphous silicon layer and bent toward and lying juxtaposed on the said exposed surface of each said transparent electrode and
   electrically connecting said bent portion of said second electrode to said exposed portion of said adjacent transparent electrode.

69. A method for manufacturing a photovoltaic device in accordance with claim 68, wherein said step of preparing said substrate comprises the step of preparing a glass material.

70. A method for manufacturing a photovoltaic device in accordance with claim 68 or 69, wherein said step of forming said transparent electrodes comprises the step of
   forming a transparent and electrically conductive layer serving as a transparent electrode on the whole surface on one main surface of said substrate, and
   selectively etching said transparent electrically conductive layer into a predetermined pattern.

71. A method for manufacturing a photovoltaic device in accordance with claim 65 or 69, wherein said step of forming said transparent electrodes comprises the step of selectively sputtering a transparent electrically conductive material on said one main surface of said substrate.

72. A method for manufacturing a photovoltaic device in accordance with claim 65, wherein said step of forming said amorphous silicon layers comprises the step of forming the amorphous silicon layers such that a portion of the corresponding transparent electrodes are exposed.

73. A method for manufacturing a photovoltaic device in accordance with claim 65, which further comprises the step of forming a transparent insulating film between said transparent electrodes and said amorphous silicon layers.

74. A method for manufacturing a photovoltaic device in accordance with claim 73, wherein said step of forming said transparent insulating film comprises the step of forming a silicon oxide film.

75. A method for manufacturing a photovoltaic device in accordance with claim 73, wherein said step of forming a transparent insulating film comprises the step of forming a silicon nitride film.

* * * * *